United States Patent [19]
Wheatley, III

[11] Patent Number: 5,099,204
[45] Date of Patent: Mar. 24, 1992

[54] LINEAR GAIN CONTROL AMPLIFIER

[75] Inventor: Charles E. Wheatley, III, Del Mar, Calif.

[73] Assignee: Qualcomm Incorporated, San Diego, Calif.

[21] Appl. No.: 598,845

[22] Filed: Oct. 15, 1990

[51] Int. Cl.⁵ .............................................. H03G 3/30
[52] U.S. Cl. ................................. 330/279; 330/306; 330/310
[58] Field of Search .............. 330/277, 278, 279, 285, 330/302, 305, 306, 310; 455/219, 234, 240, 241

[56] References Cited

U.S. PATENT DOCUMENTS

| | | | |
|---|---|---|---|
| 3,325,738 | 6/1987 | Busby et al. | 455/219 X |
| 4,500,848 | 2/1985 | Marchand et al. | 330/285 |
| 4,740,996 | 4/1988 | Somer | 455/253 X |

*Primary Examiner*—Steven Mottola
*Attorney, Agent, or Firm*—Russell B. Miller

[57] ABSTRACT

An amplification circuit having a compensation circuit for receiving a control signal and generating a corresponding compensation signal according to predetermined compensation characteristics. An input amplification circuit is provided for, receiving an input signal and the compensation signal amplifying the input signal at an input gain level determined by the compensation signal and providing a corresponding input amplification circuit output signal. A filter element receives and filters unwanted frequency components from the input amplification circuit output signal. An output amplification circuit is provided for, receiving the filtered input amplification circuit output signal and the compensation signal, amplifying the filtered input amplification circuit output signal at an output gain level determined by the compensation signal and providing a corresponding output amplification circuit output signal.

19 Claims, 2 Drawing Sheets

LINEAR GAIN CONTROL AMPLIFIER

BACKGROUND OF THE INVENTION

I. Field of the

The present invention relates to amplifiers. More particularly, the present invention relates to a novel and improved radio frequency amplifier circuit which provides linear control of gain, when such gain is measured in decibels, over a large gain range.

II. Description of the Related Art

The use of automatic gain control (AGC) circuits to control amplifier gain in communication terminals has been accomplished by many various designs. Typically the range in gain for such amplifiers is somewhat limited, and therefore are not directly useful in applications where a very large dynamic range of signals are to be accommodated.

In applications where a surface acoustic wave (SAW) filter is utilized in the receiver for band filtering, special care must be taken in choosing the impedance of the circuit seen by the SAW filter. Traditionally the SAW filter is matched in impedance with the external circuit by using simple series coupled inductors at the input and output of the SAW filter. Such simple impedance matching provides for a reduction of the well known phenomena of triple transit interference (reflections of the signal of interest within the SAW filter). However, such a reduction in triple transit is at the expense of increased insertion losses.

A typical insertion loss using a conventionally configured SAW filter is approximately 20 dB. The minimum insertion loss that a simple SAW filter is theoretically capable of producing is 6 dB. However, at the minimum insertion loss the triple transit signal is at a level that can substantially interfere with a signal of interest.

In applications requiring a large gain control, and which also utilizes SAW filters for band filtering, the loss of the SAW filter should be minimized if one is to maximize the effective range of controllable gain.

In certain applications, such as in CDMA cellular telephone transceivers where transmitter power control and receiver AGC are essential to system operation, the transmitter and receiver must both operate over a relatively high dynamic range and track each others gain change over the full range of control. In such an environment, the receiver can be required to operate over a gain range that can easily reach as high as 80 dB.

In many systems, again such as in CDMA cellular telephone transceivers, it is essential that in response to a received signal, the AGC loop should provide a signal indicative of measured signal strength which is linear, in terms of output indication as a function of dB of input. Conventional AGC circuits normally exhibit such a characteristic over only a portion of the full control range, due to nonlinearities in the gain control function of the amplifier.

It is therefore an object of the present invention to provide a novel and improved amplification circuit which, in response to a gain control signal, is capable of substantially linear gain control operation over a relatively large range.

It is another object of the present invention to provide an amplifier circuit in which gain in dB is controlled as a linear function of an input control signal.

It is yet another object of the present invention to provide active impedance matching of a SAW filter to minimize insertion loss at specified levels of triple transit signals.

It is still a further object of the present invention to provide a temperature compensated amplification circuit capable of substantially linear gain control over a large dynamic range over a wide temperature range.

SUMMARY OF THE INVENTION

The present invention is a novel and improved automatic gain control circuit controlled linear amplifier capable of linear operation over a relatively large range of gains. The amplifier of the present invention involves the utilization of two low-cost amplifiers, typically dual gate FET amplifiers, appropriately mismatched to a filter, specifically a SAW bandpass filter as a signal amplification circuit. The amplifier of the present invention further involves the utilization of a low frequency amplifier, typically an operational amplifier (op-amp), with diode feedback to provide linear gain control and temperature compensation for the signal amplification circuit over a gain operational range of over 110 dB.

In accordance with the present invention an amplifier circuit is disclosed which is capable of providing linear gain control over a high dynamic range. The circuit comprises in an exemplary embodiment a compensation circuit, a first amplifier, a filter and a second amplifier.

The compensation circuit receives a linear control signal corresponding to a log power measurement of a received signal. The compensation circuit is responsive to the control signal for generating, a corresponding nonlinear control signal, or compensation signal, according to predetermined compensation characteristics. The first amplifier is coupled to the compensation circuit for receiving the compensation signal and for receiving an input RF signal. The first amplifier amplifies the input RF signal at an input gain level determined by the compensation signal so as to provide a corresponding first amplifier output signal.

The filter is coupled to the first amplifier so as to receive the first amplifier output signal. The filter removes unwanted frequency components from the first amplifier output signal and provides a filtered first amplifier output RF signal.

The second amplifier is also coupled to the compensation circuit for receiving the compensation signal and to the filter for receiving the filtered first amplifier output signal. The second amplifier amplifies the filtered first amplifier output signal at an output gain level determined by the compensation signal so as to provide a corresponding second amplifier output RF signal.

The filter has an input and output impedance that is mismatched by the first and second amplifiers to provide a reduction in insertion loss at a predetermined triple transit level. The compensation circuit compensates for inherent device nonlinearities in gain, for a linear control signal, of the first and second amplifiers over the large dynamic range of operation required. The compensation circuit also provides for temperature compensation of the first and second amplifiers so as to reduce the adverse affects of changes in temperature on gain.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
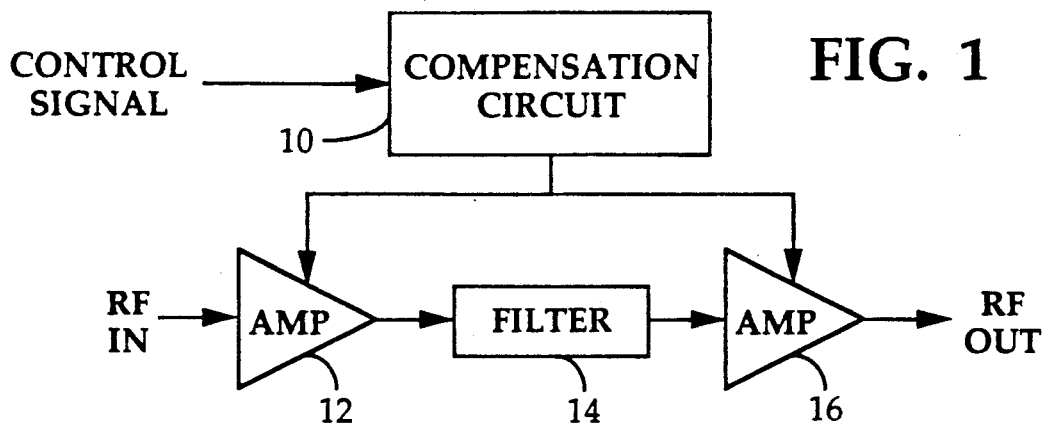
FIG. 1 is a block diagram of an exemplary embodiment of the linearized automatic gain control amplifier of the present invention.

Referring to the drawings, FIG. 1 illustrates in block diagram form an exemplary embodiment of the linear amplification circuit of the present invention. The typical environment in which the circuit of FIG. 1 is implemented is in an automatic gain control (AGC) circuit.

The use of AGC circuits are well known in the communications art for receivers or transceivers operating in the RF frequency band. AGC circuits are typically used for, based upon the strength of the received signal, controlling the power of a received signal for later processing of the signal and also for controlling transmitter power. In the AGC circuit, a measurement of signal strength, or power, of the received signal is performed at some other point where an AGC signal is generated. The AGC signal is typically provided as a gain control signal to a variable gain amplifier. The amplifier in response to the AGC signal adjusts the amount of gain applied to the received signal. The amplifier gain may be negative or positive depending upon system parameters and signal strength.

The amplification circuit of FIG. 1 is comprised of compensation circuit 10, variable gain amplifier circuit 12, filter 14 and variable gain amplifier circuit 16. In FIG. 1, a gain control signal is provided to compensation circuit 10. In an AGC application, such a control signal is generated by a signal strength measurement circuit (not shown) in linear correspondence with the log of the measured signal strength of the received RF signal, or corresponding IF signal if frequency downconverted before measurement.

The control signal is provided as an input to compensation circuit 10 where the control signal is modified according to predetermined compensation characteristics. Compensation circuit 10 provides compensation in the control signal for inherent nonlinearities in the amplification circuitry used to amplify the input RF signal, corresponding to the received RF signal. Compensation circuit 10 thus generates a compensated control signal which is output therefrom as a nonlinear control signal or compensation signal. It should be understood that the compensation signal is typically linear with respect to the control signal, except for those portions of the gain curve for the amplifier circuits where nonlinearities occur in response to a linear control signal.

In a CDMA mobile telephone, the amplification circuitry is required to operate over a high dynamic range, such as in excess of 80 dB. The amplification circuitry employed in this application must be low in cost for maximum commercial exploitation. Such a low cost design employs amplifier components which can experience nonlinearities in gain when conventional techniques are used in gain control over a large operational gain range. For proper operation of the mobile telephone at such a large operational gain range, compensation must be provided. Accurate gain control is particularly critical if pairs of gain controlled elements are to be used. In such an application, gain controlled amplifiers are used in both the receiver and transmitter and must track each other with respect to gain variation or adjustment.

In the exemplary embodiment, a cascaded amplifier scheme is used to provide variable gain control in amplification of the received signal. Disposed between the cascaded amplifiers is a filter which removes out of band frequency components from the RF signal. The dual amplifiers also serve to provide active impedance matching of the filter.

As illustrated in FIG. 1, amplifier circuits 12 and 14 both receive, at a respective gain control input, the compensation signal from compensation circuit 10. Amplifier circuit 12 receives the RF signal at an input and amplifies the signal at a gain level as determined by the compensation signal. The amplified signal is output from an output of amplifier circuit 12 signal as a input to filter 14.

Filter 14 is typically a bandpass filter, although other filter types may be used depending on the frequency plan. In the mobile telephone application, filter 14 may be implemented as a SAW filter. Filter 14 removes unwanted frequency components from the RF signal. Filter 14 provides the filtered signal at an output thereof to an input of amplifier circuit 16. Amplifier circuit 16 receives the filtered RF signal at an input and amplifies the signal at a gain level as determined by the compensation signal.

Filter 14 implemented as a SAW filter has an inherent input and output impedance that must be properly mismatched to provide a minimum insertion loss at a level of tolerable triple transit. Typically SAW filters employ a passive component, such as an inductor, at the input and output to provide the proper impedance matching to translate the filter impedance to a value appropriate for coupling to 50Ω circuit elements. However, such impedance matching techniques result in insertion losses much greater than the theoretical minimum 6 dB, and typically on the order of 20-25 dB to avoid problems caused by the triple transit effect. In using a cascaded amplifier arrangement, amplifier circuits 12 and 16 provide "active" impedance matching which enables maximum reduction of insertion loss to a level which has a tolerable triple transit effect. Insertion losses can thus be readily achieved in the more optimum range of 14-15 dB.

Figure 2:
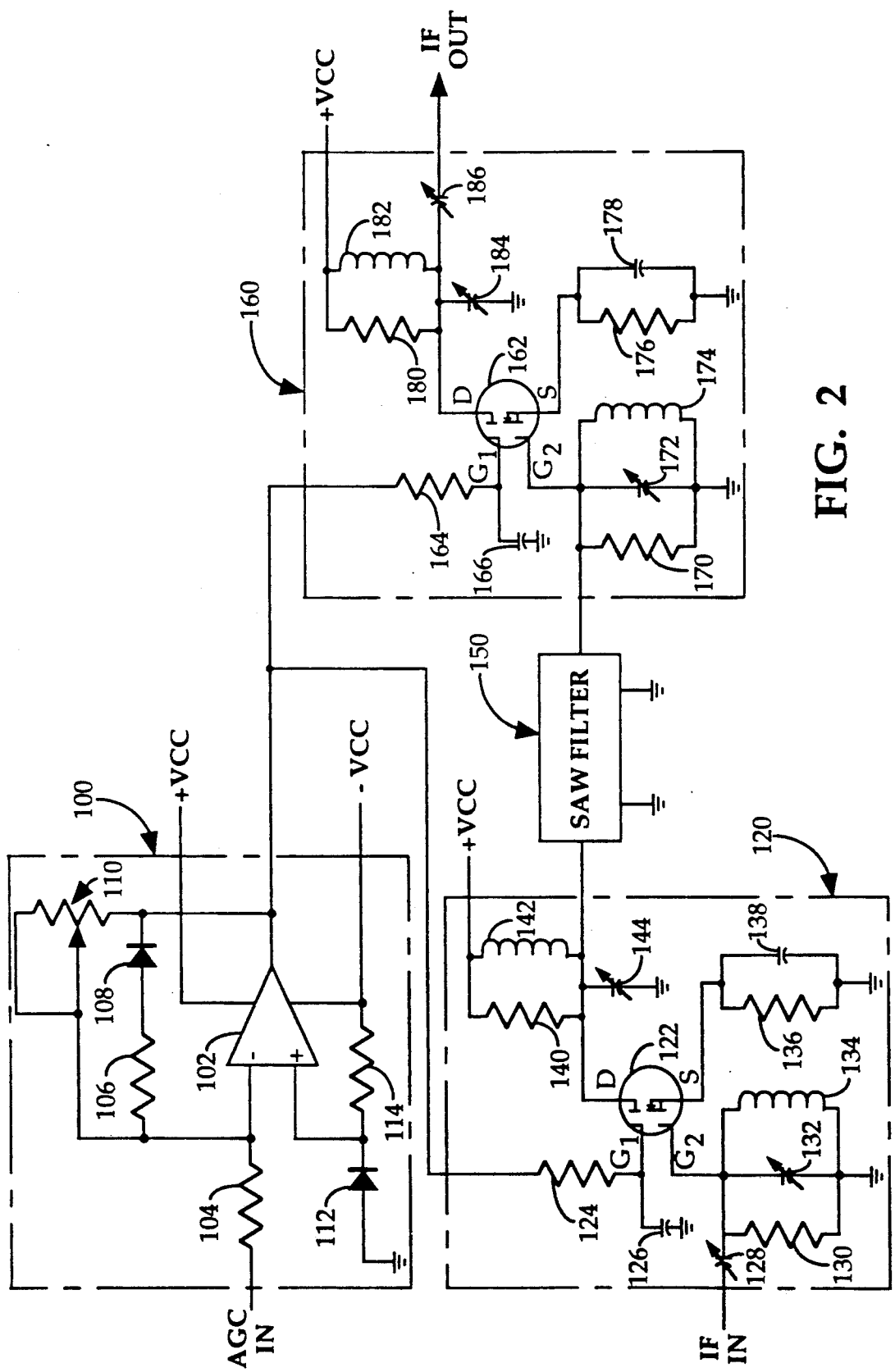
FIG. 2 is an exemplary schematical circuit diagram of the linearized automatic gain control amplifier of FIG. 1.

FIG. 2 illustrates in further detail an exemplary embodiment of the amplification circuit of FIG. 1. Compensation circuit 100 receives an AGC signal and in response thereto generates the appropriate compensation. The resulting compensation signal is output from compensation circuit 100 to both amplifier circuits 120 and 160.

Amplifier circuit 120 receives and amplifies an input IF signal at a gain level determined by the compensation signal. The amplified IF signal is then output to filter 150 where it is bandpass filtered and output to amplifier circuit 160. Amplifier circuit 160 receives the amplified and filtered IF signal where amplified at a gain level determined by the compensation signal. The amplified IF signal is then output from amplifier circuit 160 for further processing.

Compensation circuit 100 is comprised of an operational amplifier, op amp 102, which has an inverting input coupled to receive the AGC signal through input resistor 104. The inverting input is also coupled to the output of op amp 102 through a nonlinear feedback circuit comprised of series coupled resistor 106 and diode 108 which are coupled in parallel with variable resistor 110. The noninverting input of op amp 102 is provided with a reference or bias voltage across diode 112 that is provided through resistor 114 from the supply voltage −VCC. Resistors 104, 106 and 114 are typically of the same resistance, e.g., 10 KΩ value, while variable resistor 110 is capable or providing a much larger resistance value, e.g. 50 KΩ.

In the operation of compensation circuit 100, when the AGC voltage is above the bias voltage appearing at the noninverting input of op amp 102, the parallel resistance combination of resistor 106 and variable resistor 110, along with input resistor 104 (R106∥R110/R104) set a first slope gain curve for operation of op amp 102. When the AGC voltage is below the bias voltage, the value of variable resistor 110 along with input resistor 104 (R110/R104) set a second, and different, gain curve for operation of op amp 102. Furthermore diodes 108 and 114 are preferably of the same type such that changes in temperature affecting diode 108, and thus the feedback, similarly affect diode 114 and the bias voltage. In the alternative, diode 114 may be replaced by a temperature sensitive element such as a thermistor. It should be understood that the bias voltage appearing at the noninverting input of op amp 102 may be established at many different levels and by many different ways that are well known in the art.

The compensation signal generated by compensation circuit 100 is output from op amp 102 to both of amplifier circuits 120 and 160. Amplifier circuit 120 is typically comprised of dual gate FET amplifier 122 which has one gate ($G_1$) coupled through resistor 124 to the output of op amp 102 and through capacitor 126 to ground. The other gate ($G_2$) of FET 122 receives the input IF signal through variable capacitor 128, and is coupled to ground through the parallel combination of resistor 130, variable capacitor 132 and inductor 134. The source (S) of FET 122 is also coupled to ground through the parallel combination of resistor 136 and capacitor 138. The drain (D) of FET 122 is coupled to the supply voltage +VCC through the parallel combination of resistor 140 and inductor 142 while also being coupled to ground through variable capacitor 144. The drain (D) of FET 122 is coupled to the input of SAW filter 150.

The voltage at gate ($G_1$) as determined by the output of op amp 102 controls the level of gain of FET 122. The input IF signal is amplified at the determined gain level by FET 122 with the output voltage appearing across the input transducer (not shown) of SAW filter 150. The parallel combination of resistor 140 and inductor 142 are of values selected such that, in combination with the output impedance of FET 122 appearing at the drain (D), the impedance of this circuit supplies the source impedance seen by SAW filter 150.

It may be shown by using simple, tuned matching networks, the total insertion loss (IL) of the complete SAW filter is approximately:

$$IL = \left| \frac{2G_aG_s}{(G_a + G_s)^2} \right|^2 \quad (1)$$

where:
$G_a$ is the real part of the acoustic admittance; and
$G_s$ is the real part of the source and load admittances.

Also, it may be shown that the triple transit response (TTR) of the complete filter is defined by:

$$TTR = \left| \frac{2G_aG_s}{(G_a + G_s)^2} \right|^2 \cdot \left| \frac{G_a^2}{(G_a + G_s)^2} \right|^2 \quad (2)$$

Using the relationships set forth by equations (1) and (2), one can compute that for a triple transit response of 30 dB, relative to the main signal, an insertion loss of 12 dB can be achieved.

Amplifier circuit 160 is constructed in a manner similar to that of amplifier circuit 120. Amplifier circuit 160 is is comprised of dual gate FET amplifier 162, preferably the same as FET 122, which has one gate ($G_1$) coupled through resistor 164 to the output of op amp 102 and through capacitor 166 to ground. The other gate ($G_2$) of FET 162 is coupled to the output of SAW filter 150 for receiving the filtered and amplified IF signal the output therefrom, and is coupled to ground through the parallel combination of resistor 170, variable capacitor 172 and inductor 174. The source (S) of FET 162 is also coupled to ground through the parallel combination of resistor 176 and capacitor 178. The drain (D) of FET 162 is coupled to the supply voltage +VCC through the parallel combination of resistor 180 and inductor 182 while also being coupled to ground through variable capacitor 184. The output of FET 162 is provided through variable capacitor 186 also coupled to the drain (D) of FET 162.

The voltage at gate ($G_1$), as determined by the output of op amp 102, again controls the level of gain of FET 162. The IF signal output from SAW filter 150 is amplified at the determined gain level by FET 162 with the output voltage appearing at the output of variable capacitor 186. The parallel combination of resistor 170 and inductor 172 are of values selected such that, in combination with the input impedance of FET 162 appearing at the gate ($G_2$), the impedance of this circuit provides the proper load for the output impedance of SAW filter 150.

In should be noted that the output impedance of a FET is typically greater than the input impedance. In amplifier circuit 120, resistor 140 is used to set the output impedance of the circuit to match the input of SAW filter 150. In amplifier circuit 160, resistor 170 is used to set the input impedance of the circuit to match the output impedance of SAW filter 150. The value of resistor 170 is lower in value than resistor 140 since the input impedance of the FET is greater than its output impedance. This mismatch in amplifier selected resistor values provides compensation for the difference in FET input and output impedance for impedance matching to any circuit element. In the embodiment shown herein, the resistors largely set the impedances with variations in FET impedances are not critical. It is further envisioned that more gain could be realized using transformer matching techniques.

Figure 3:
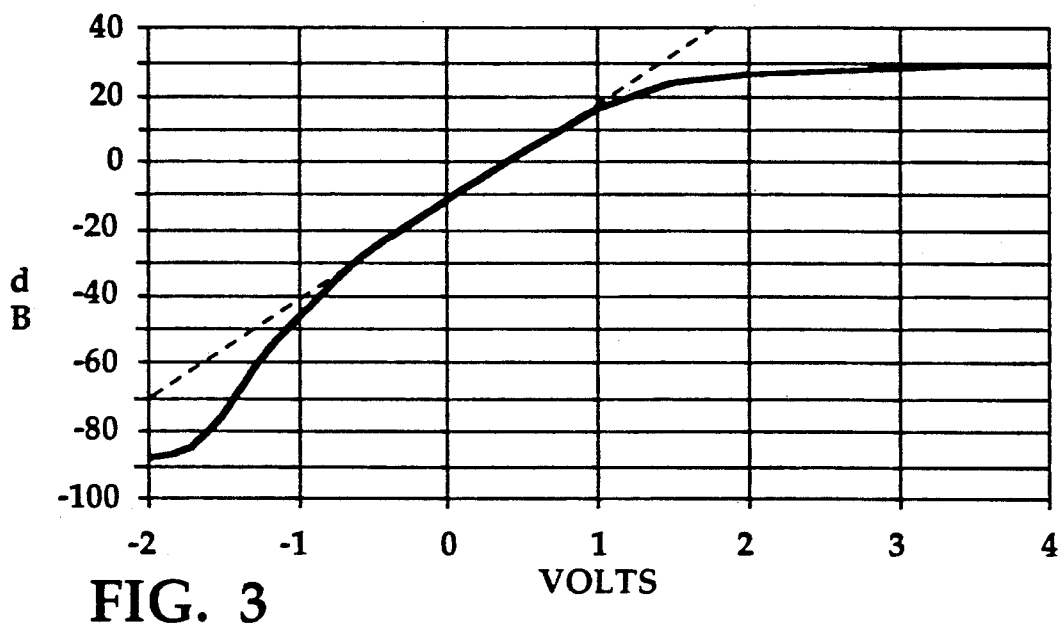
FIG. 3 is a graph illustrating the inherent gain characteristic of the uncompensated amplifier circuit used in the embodiment of FIG. 2.

FIG. 3 illustrates in graphical form the gain characteristics of the amplifier circuit without compensation of the AGC signal. The solid line and the dashed line respectively represent the actual gain characteristic curve and the desired gain characteristic curve. The circuit has straight line control of gain in dB for gain values from about −40 dB to about 20 dB. The uncompensated amplifier circuit thus provides an operational region of 60 dB, where gain in dB is a linear function of the input voltage applied to the gain control input of the amplifiers. In the region below −40 dB, the actual gain departs quite radically from the desired straight line desired gain curve. It is this region below −40 dB which the present invention predominantly seeks to provide an improved correlation to the desired gain characteristic curve.

Figure 4:
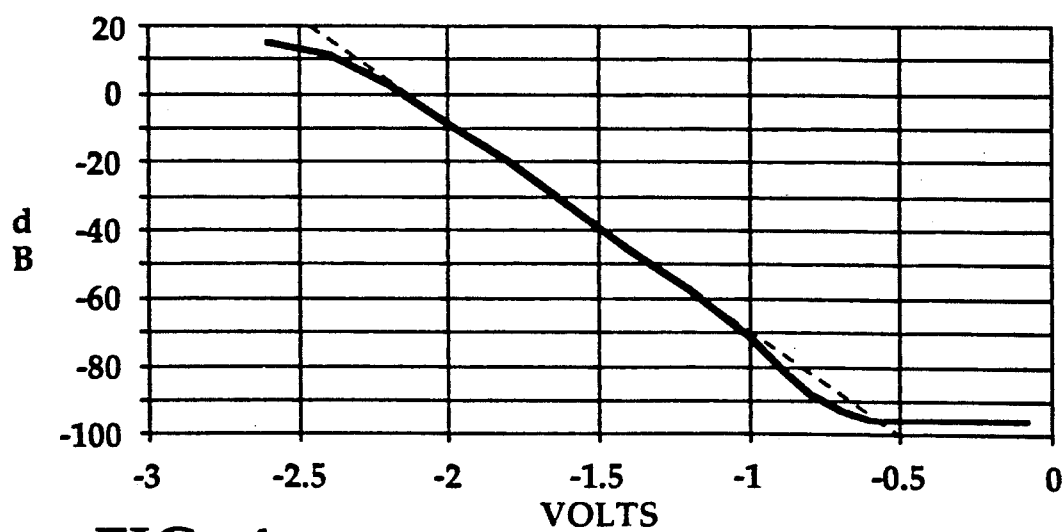
FIG. 4 is a graph illustrating the linearized gain characteristic of the compensated amplifier circuit used in the embodiment of FIG. 2.

FIG. 4 illustrates in graphical form the gain characteristics of the amplifier circuit with compensation of the AGC signal. The solid line and the dashed line again respectively represent the actual gain characteristic curve and the desired linear gain characteristic curve. The circuit has straight line control of gain in dB for gain values from about −75 dB to about 10 dB. The compensated amplifier circuit thus provides an operational region of operation of about 85 dB, where gain in dB is a linear function of the input voltage applied to the gain control input of the amplifiers. In the region below −75 dB, the actual gain is markedly closer to the desired straight line gain curve than for the uncompensated circuit. It is therefore readily be seen that by providing a compensated AGC signal in the amplifier circuit of the present invention that an extended range of gain control in dB, which is a linear function of the input AGC signal, is possible.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An amplification circuit for amplifying an input signal where signal gain in decibels (dB) is a linear function of a control signal comprising:
   compensation means for receiving a control signal and generating a corresponding compensation signal according to predetermined gain compensation characteristics;
   input amplification means for, receiving an input signal and said compensation signal, amplifying said input signal at an input gain level determined by said compensation signal and providing a corresponding input amplification means output signal, said input amplification means gain in dB being a linear function of said control signal over a predetermined gain range;
   filter means for receiving and filtering said input amplification means output signal; and
   output amplification means for, receiving said filtered input amplification means output signal and said compensation signal, amplifying said filtered input amplification means output signal at an output gain level determined by said compensation signal and providing a corresponding output amplification means output signal, said output amplification means gain in dB being a linear function of said control signal over said predetermined gain range.

2. The amplification circuit of claim 1 wherein:
   said filter means has a predetermined input and output impedance;
   said input amplification means is further for providing a selected output impedance so as to match said filter means input impedance; and
   said output amplification means is further for providing a selected input impedance so as to match said filter means output impedance.

3. The amplification circuit of claim 1 wherein said filter means comprises a surface acoustic wave (SAW) filter.

4. The amplification circuit of claim 3 wherein said input and output amplification means each comprises a FET amplifier.

5. The amplification circuit of claim 4 wherein:
   said filter has a predetermined input and output impedance;
   said input amplification means FET amplifier has a predetermined output impedance matched to said filter input impedance; and
   said output amplification means FET amplifier has a predetermined input impedance matched to said filter output impedance.

6. An amplifier circuit, for use with an automatic gain control (AGC) circuit which generates an AGC signal, for in response to said AGC signal providing gain control of an input signal over a high dynamic range, said gain control being a linear function of said AGC control signal comprising:
   a compensation circuit having an input and an output, said compensation circuit capable of receiving said AGC signal at said compensation circuit input and modifying said AGC signal according to predetermined gain compensation characteristics so as to provide a modified AGC signal at said compensation circuit output;
   a first amplifier having a pair of inputs and an output, one of said first amplifier inputs coupled to said compensation circuit output and another one of said first amplifier inputs capable of receiving said input signal, said first amplifier having portions of a gain range in decibels (dB) which are piecewise linear with respect to said AGC signal, and said first amplifier gain range linear with respect to said modified AGC signal;
   a filter having an input and an output, said filter input coupled to said first amplifier output; and
   a second amplifier having a pair of inputs and an output, one of said second amplifier inputs coupled to said compensation circuit output and another one of said second amplifier inputs coupled to said filter output, said second amplifier having portions of a gain range in dB which are piecewise linear with respect to said AGC signal, and said second amplifier gain range linear with respect to said modified AGC signal.

7. The circuit of claim 6 wherein said filter comprises a surface acoustic wave (SAW) bandpass filter.

8. The circuit of claim 6 wherein said first and second amplifiers each comprise a dual gate FET amplifier.

9. The circuit of claim 7 wherein said first and second amplifiers each comprise a dual gate FET amplifier.

10. The circuit of claim 9 wherein:
    said first amplifier further comprises a first impedance matching circuit coupled to said first amplifier output for matching an input impedance of said filter for a predetermined level of triple transit response of said filter; and said second amplifier further comprises a second impedance matching circuit coupled to said first amplifier other input for matching an output impedance of said filter for said predetermined level of triple transit response of said filter; and wherein said filter has an insertion loss corresponding to impedance levels established by said first amplifier in combination with said first impedance matching circuit and said second amplifier in combination with said second impedance matching circuit.

11. The circuit of claim 6 wherein said compensation circuit comprises:

an operational amplifier having a noninverting input capable of receiving a reference voltage, an inverting input capable of receiving an AGC signal and an output; and a nonlinear feedback network coupled between said operational amplifier output and said inverting input.

12. The circuit of claim 11 further comprising thermal compensation means coupled to said noninverting input for controlling the level of said reference voltage as applied to said noninverting input.

13. The circuit of claim 9 wherein said compensation circuit comprises:

an operational amp having a noninverting input capable of receiving a reference voltage, an inverting input capable of receiving an AGC signal and an output; and a nonlinear feedback network coupled between said op amp output and said inverting input.

14. The circuit of claim 13 further comprising compensation means coupled to said noninverting input for controlling the level of said reference voltage as applied to said noninverting input.

15. An method for amplifying over a high dynamic range an input signal where signal gain in decibels (dB) is a linear function of a control signal, said method comprising the steps of:

generating, in response to a linear control signal, a corresponding compensation signal according to predetermined gain compensation characteristics;

amplifying an input signal at an input gain level determined by said compensation signal and providing a corresponding first amplified signal, said first amplified signal being of a gain in dB which is a linear function of said control signal;

filtering said first amplified signal; and amplifying said filtered first amplified signal at an output gain level determined by said compensation signal and providing a corresponding second amplified signal, said second amplified signal being of a gain in dB which is a linear function of said control signal.

16. The method of claim 15, wherein said input signal is amplified by a first amplifier, said first amplified signal is filtered by a filter having a predetermined input and output impedance, and said filtered first amplified signal is amplified by a second amplifier, said method further comprising the step of providing impedance matching of said first and second amplifiers to said filter for a predetermined level of filter triple transit response.

17. The method of claim 15 wherein said step of generating said compensation signal comprises the steps of:

modifying said control signal according to a first gain compensation curve when said control signal is below a first predetermined level; and modifying said control signal according to a second gain compensation curve when said control signal is above said first predetermined level.

18. The amplification circuit of claim 1 wherein said input and output amplification means each provide signal gain in dB as a first linear function of said control signal over a portion of said predetermined gain range and as a second linear function of said control signal over gains exceeding said predetermined gain range portion, said compensation means modifying said control signal corresponding to input and output amplification means gains exceeding said predetermined gain range.

19. The circuit of claim 6 wherein said first and second amplifiers are responsive to said modified AGC signal for providing a signal gain in dB over said gain range which is in linear correspondence with said AGC signal.

* * * * *